(12) United States Patent
Sato

(10) Patent No.: US 6,381,796 B1
(45) Date of Patent: May 7, 2002

(54) SPINNING WASHER FOR WAFERS

(75) Inventor: Yoshimi Sato, Tokyo (JP)

(73) Assignee: Disco Corporation, Tokyo (JP)

( * ) Notice: Subject to any disclaimer, the term of this patent is extended or adjusted under 35 U.S.C. 154(b) by 0 days.

(21) Appl. No.: 09/522,626

(22) Filed: Mar. 10, 2000

(30) Foreign Application Priority Data

Mar. 12, 1999 (JP) ............................................ 11-066213

(51) Int. Cl.$^7$ ................................................ B08B 1/04
(52) U.S. Cl. .............................. 15/77; 15/88.1; 15/88.2
(58) Field of Search .......................... 15/77, 88.1, 88.2, 15/102, 21.1

(56) References Cited

U.S. PATENT DOCUMENTS

| | | | | |
|---|---|---|---|---|
| 1,503,217 A | * | 7/1924 | Voulgares | ................ 15/88.2 X |
| 2,874,395 A | * | 2/1959 | Blash | .......................... 15/88.2 |
| 3,366,390 A | * | 1/1968 | Applequist et al. | .......... 15/77 X |
| 3,803,660 A | * | 4/1974 | Jividen et al. | ................ 15/88.2 |
| 4,811,443 A | * | 3/1989 | Nishizawa | ................ 15/102 X |
| 5,651,160 A | * | 7/1997 | Yonemizu et al. | ........... 15/77 X |
| 5,729,856 A | * | 3/1998 | Jang et al. | .................... 15/88.1 |

* cited by examiner

*Primary Examiner*—Mark Spisich
(74) *Attorney, Agent, or Firm*—Rader, Fishman & Grauer, PLLC

(57) ABSTRACT

Disclosed is an improved spinning washer comprising: a spinning table for fixedly holding a wafer to be washed; water flushing device; first brush which can be put in coplanar position relative to the lower surface of the wafer round the circumference of the spinning table; and second brush confronting the first brush. The second brush can be put in contact with the upper surface of the wafer in its operative position. The opposite surfaces and circumference side of the wafer can be washed without the fear of breaking the wafer no matter how it may be thin.

3 Claims, 7 Drawing Sheets

SPINNING WASHER FOR WAFERS

BACKGROUND OF THE INVENTION

1. Field of the Invention

The present invention relates to a spinning washer for washing and removing debris from semiconductor wafers and other workpieces after being ground.

2. Related Arts

Semiconductor wafers and other workpieces are prone to be contaminated with debris after being ground. It is, therefore, necessary to wash and remove debris from such contaminated semiconductor wafers by using a spinning washer as shown in FIGS. 7 and 8.

In the spinning washer 50, the spinning table 51 holds fixedly a semiconductor wafer W, and the spinning table 51 is rotated at a high speed while flushing water from the water nozzle 52. Etching liquid can be supplied from the etching liquid nozzle 53 to the semiconductor wafer W to meet occasional demands.

After washing, the spinning table 51 continues rotating at the increased speed while the air nozzle 54 ejects air at an increased pressure, thereby drying the semiconductor wafer W.

As seen from FIG. 8, the semiconductor wafer W is often larger than the spinning table 51, so that the semiconductor wafer W may be held only at its center area. The circumferential area of the semiconductor wafer W extending beyond the underlying spinning table 51, therefore, is not stable, and when exposed to the flushing water or blowing air, the circumferential area of the semiconductor wafer W is prone to be deformed or broken.

As the recent tendency, semiconductor wafers have been decreasing less and less in thickness to meet the ever increasing demand for reducing to possible minimum the size and weight of cellular phones, note-sized personal computers and other electronic devices. Sometimes, semiconductor wafers are ground to be 100 microns or less thin. Such thin wafers are likely to be broken while being washed or dried.

Referring to FIG. 9, an adhesive tape T is applied to one side of the semiconductor wafer W, and the semiconductor wafer is laid on the holding table 55 with its tape T down. As seen from the drawing, the holding table 55 is larger than the semiconductor wafer W. A negative pressure is applied to the semiconductor wafer W so that it may be fixedly held on the holding table 55. Then, the semiconductor wafer W is subjected to grinding with a grindstone 57. Debris is produced by grinding the semiconductor wafer W to be sucked to the holding table 55 as the negative pressure prevails therearound. Thus, the circumferential side 56 of the semiconductor wafer W is contaminated with debris.

When the washing is effected as in FIG. 8, debris can be removed from the surface of the semiconductor wafer W, but debris can be hardly removed from the circumferential side 56 of the semiconductor wafer W, allowing the debris to be stuck to the circumferential side 56, thus making it difficult to peel the adhesive tape T off from the semiconductor wafer W at a later step.

SUMMARY OF THE INVENTION

One object of the present invention is to provide a spinning washer which can wash the opposite surfaces as well as the circumferential side of a semiconductor wafer without the fear of breaking the semiconductor wafer no matter how thin it may be.

To attain this object a spinning washer according to the present invention comprises: a spinning table for fixedly holding a wafer, the spinning table being capable of turning at a high speed; water flushing means for flushing water to the wafer held on the spinning table; first brush means which can be put in coplanar position relative to the upper surface of the wafer around the circumference of the spinning table; and second brush means confronting the first brush means, the second brush means being adapted to be selectively put in operative or inoperative position, the second brush means being put in contact with the upper surface of the wafer in the operative position.

The first brush means may comprise an annular base having its outer diameter larger than that of the wafer, and an opening made at its center, the opening being large enough to allow the spinning table to pass freely therethrough, a first stiff-hair section stuck on the upper surface of the annular base, and a first piston-and-cylinder for raising or lowering the annular base, thereby putting the first stiff-hair section in the operative or inoperative position, when put in the operative position, the first stiff-hair section being yieldingly depressed by the overlying wafer, leaving the circumferential stiff-hair part upright, surrounding closely the circumference side of the wafer.

The second brush means may comprise a disk, a second stiff-hair section stuck on the lower surface of the disk, an arm holding the disk rotatably, a second piston-and-cylinder for raising or lowering the arm, thereby putting the second stiff-hair section in operative or inoperative position, and a drive unit for rotating the second piston-and-cylinder thereby to swing the arm and hence the second brush, when put in the operative position, the second stiff-hair section being pushed against the upper surface of the wafer, thus sandwiching the wafer between the first and second stiff-hair sections.

Other objects and advantages of the present invention will be understood from the following description of a spinning washer according to one preferred embodiment of the present invention, which is shown in accompanying drawings.

DETAILED DESCRIPTION OF PREFERRED EMBODIMENT

Figure 1:
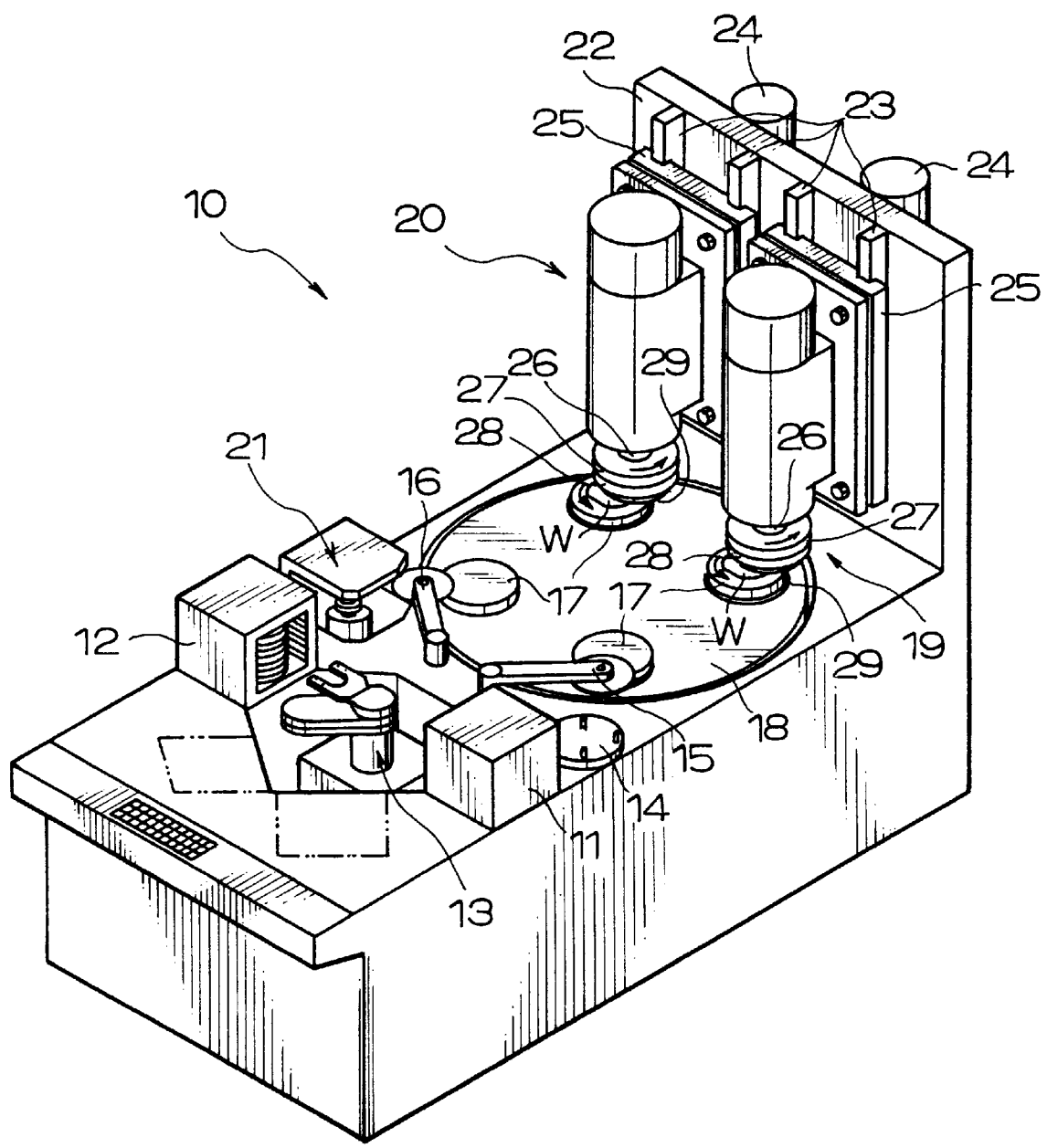
FIG. 1 is a perspective view of a grinding machine equipped with a spinning washer according to the present invention.

Referring to FIG. 1, a grinding machine 10 is equipped with a spinning washer 21 according to one embodiment of the present invention.

The grinding machine 10 comprises first and second cassettes 11 and 12 for containing semiconductor wafers W, taking-out and -in means 13 for taking wafers from the first cassette 11 and for taking wafers in the second cassette 12, a centering table 14 for putting a selected wafer in correct position, first wafer-transporting means 15, second wafer-transporting means 16, a turn table 18 having four wafer-holders 17 provided thereon, first and second grinding units 19 and 20 and a spinning washer-and-drier 21.

Wafers to be ground are stored in the first cassette 11, and a selected wafer W is taken out by the taking-in and out means 13 to be put on the centering table 14. After orienting the wafer W there on the centering table 14, the wafer W is sucked to the first transporting means 15 by applying a negative pressure to the wafer W, and the first transporting means 15 is rotated to put the wafer W on a selected holder 17.

Then, the turn table 18 is made to turn a predetermined degrees counterclockwise so that the holder 17 bearing the wafer W is put under the first grinding unit 19. The wafer W is subjected to the coarse grinding there. After finishing the coarse grinding the turn table 18 is made to turn another predetermined degrees counterclockwise so that the holder 17 bearing the coarse-ground wafer W is put under the second grinding unit 20 for fine grinding.

As shown, these grinding units 19 and 20 can be raised and lowered along the upright wall 22. Specifically a pair of rails 23 are laid on the upright wall 22, and a slide plate 25 bearing the first or second grinding unit 19 or 20 rides on these rails 23. The slide plate 25 can be driven by an associated drive source 24.

The first or second grinding unit 19 or 20 includes a rotary spindle 26 having a grinding wheel 28 fixed to its tip via an associated mount 27. The grinding wheel has a coarse or fine grinding stone 29 projecting from its lower surface.

The turn table 18 is made to turn still another predetermined degrees counterclockwise to bring the fine-ground wafer W close to the second transporting means 16, which sucks the wafer W to transfer it to the spinning washer 21.

Figure 2:
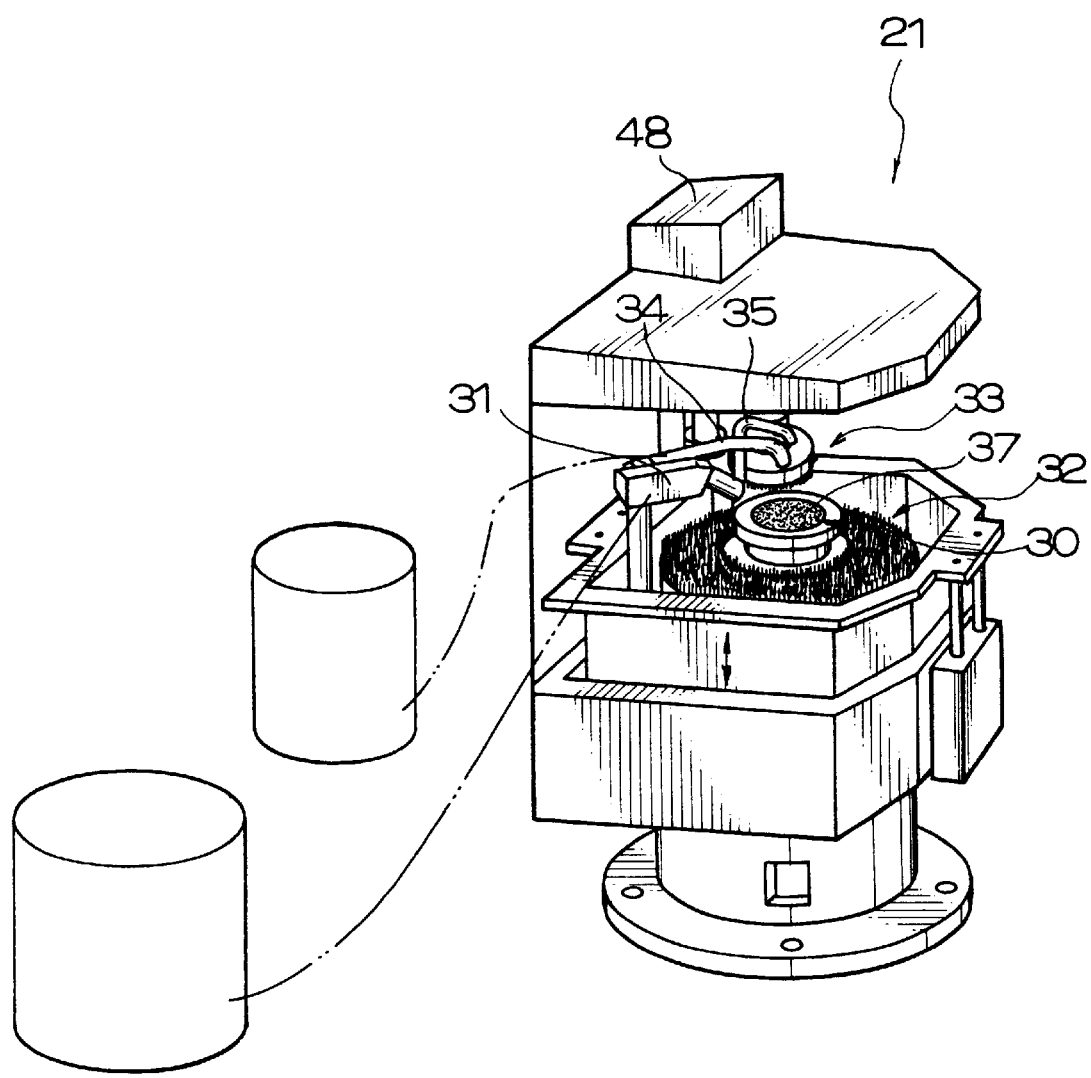
FIG. 2 is a perspective view of the spinning washer.

Referring to FIG. 2, the spinning washer 21 comprises a spinning table 30 for fixedly holding a wafer, water flushing means 31 for flushing water to the wafer held on the spinning table, first brush means 32 and second brush means 33 confronting the first brush means 32. It may comprise etching supplying means 34 and air blowing means 35 to meet occasional demands.

The water flushing means 31 is a nozzle directed to the wafer on the spinning table 30 for flushing water over the wafer.

Figure 3:
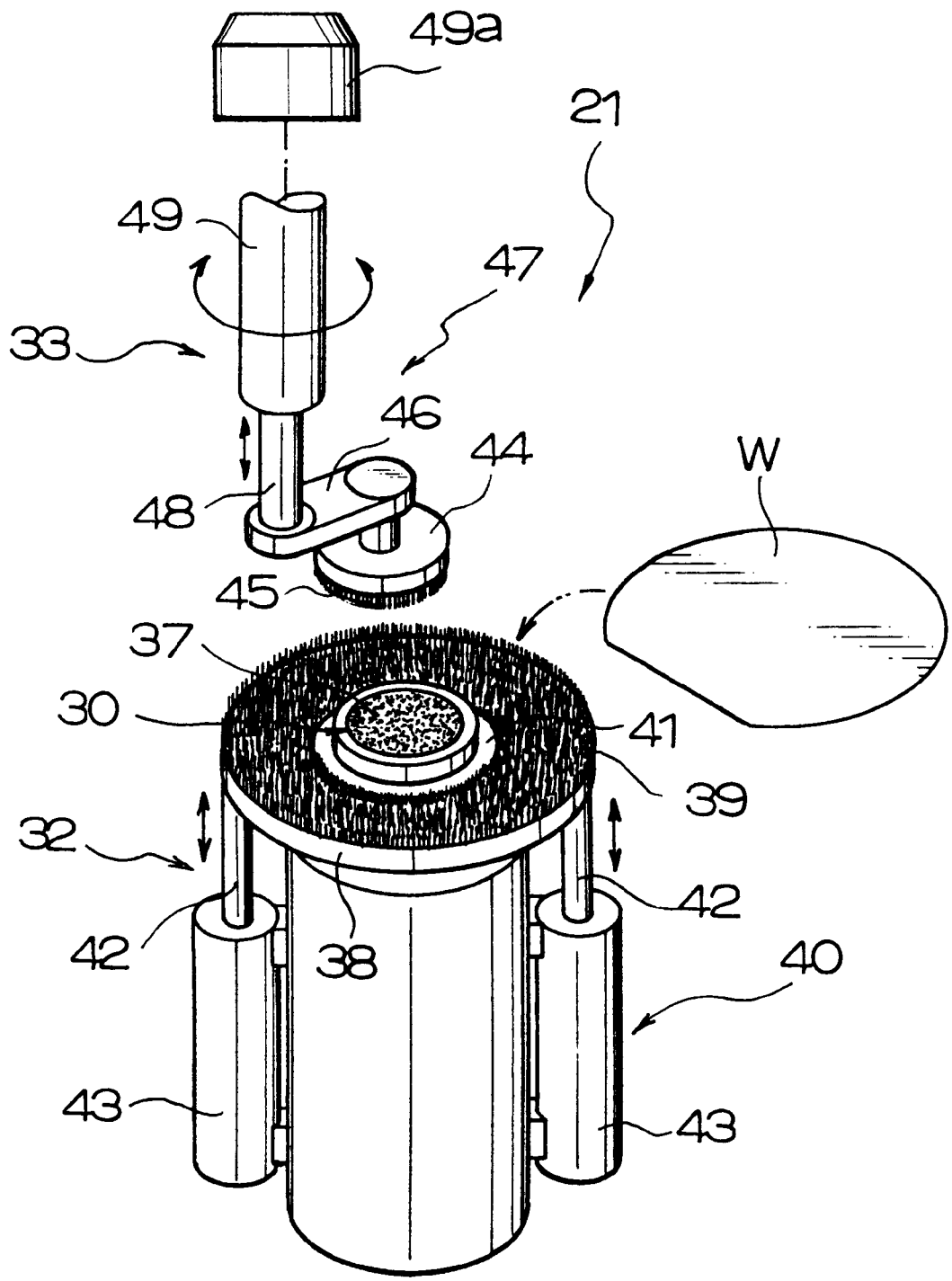
FIG. 3 is an exploded view of the spinning washer.

Referring to FIG. 3, the spinning table 30 has a suction area defined within its rim. It has a drive source (not shown) installed therein, and is capable of turning at a high speed.

Figure 4:
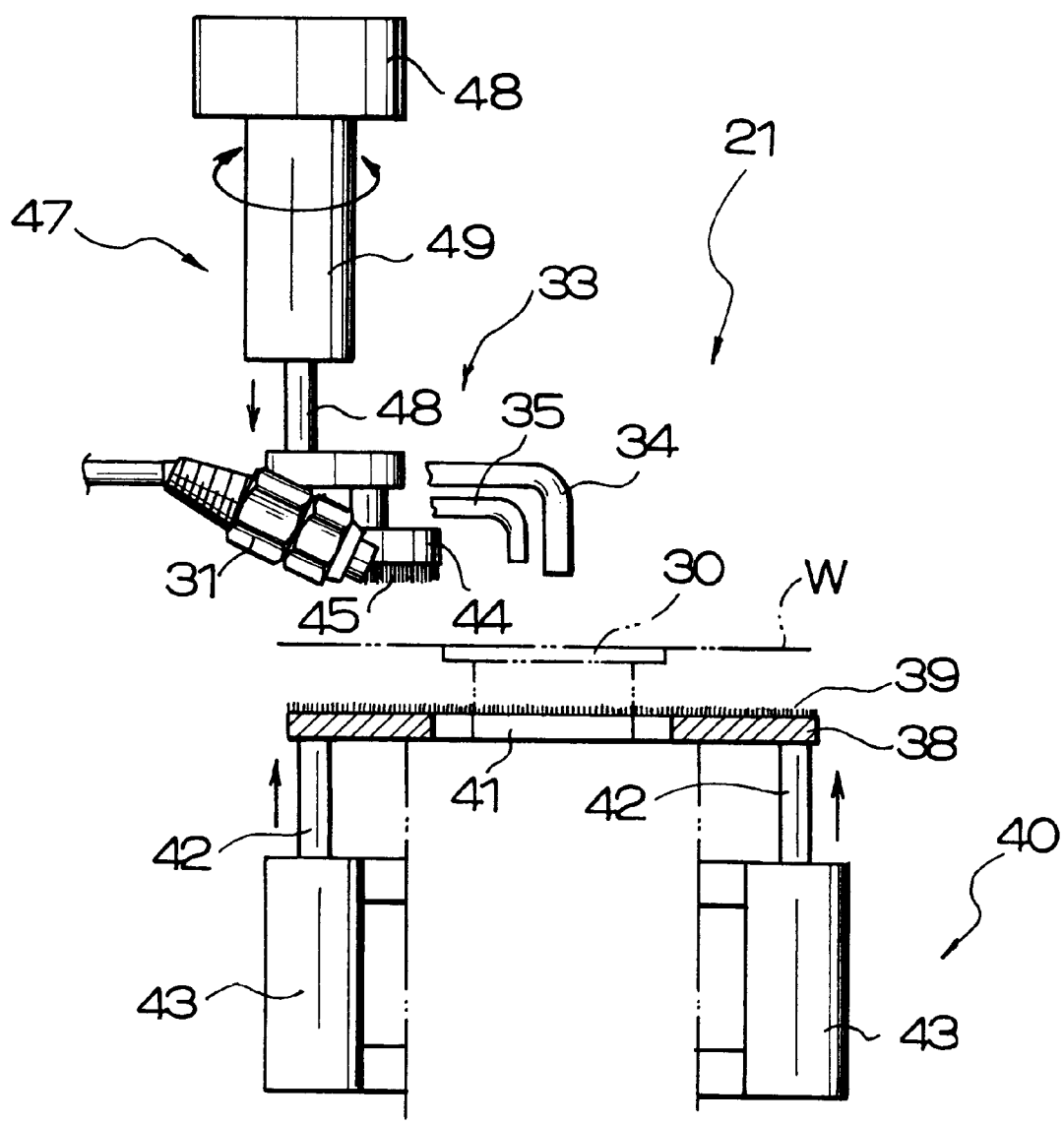
FIG. 4 is a side view of the major part of the spinning washer.

Referring to FIG. 4, the first brush means 32 comprises an annular base 38, a stiff-hair section 39 formed on the whole upper surface of the annular base 38 and a pair of first piston-and-cylinders 40 for raising or descending the annular base 38.

The outer diameter of the annular base 38 is larger than that of the wafer W, and it has a circular opening 41 made at its center. The circular opening 41 is large enough to allow the spinning table 30 to pass freely therethrough. The first stiff-hair section 39 is stuck on the upper surface of the annular base 38. A pair of pistons 42 are fixed to the bottom of the annular base 38, and are slidably fitted in the associated cylinders 43.

The second brush means 33 comprises a disk 44 whose diameter is approximately equal to the difference between the outer and inner diameters of the annular base 38, a second stiff-hair section stuck on the disk 44, an arm 46 rotatably supporting the disk 44, a second piston-and-cylinder 47, which rotatably supports the arm 46, and can raise or descend the arm 46, and a drive means 49a for rotating the second piston 47.

The second piston-and-cylinder 47 comprises a second piston 48 and a second cylinder 49 in which the second piston 48 is slidably fitted. The lower end of the second piston 48 is fixed to one end of the arm 46. The second cylinder 49 can be rotated by the drive means 49a. When the second cylinder 49 and piston 48 is rotated alternately in the opposite directions, the arm 46, and hence the disk 44 and second stiff-hair section 45 swing within the circular arc range, traversing the center of the spinning table 30 from one selected point to the counter point on the outer circumference of the disk 38.

Figure 5A:
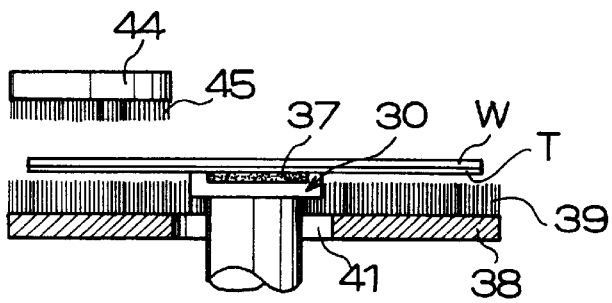
FIGS. 5(*a*), (*b*) and (*c*) illustrate how a semiconductor wafer is washed by the spinning washer.
Figure 5B:
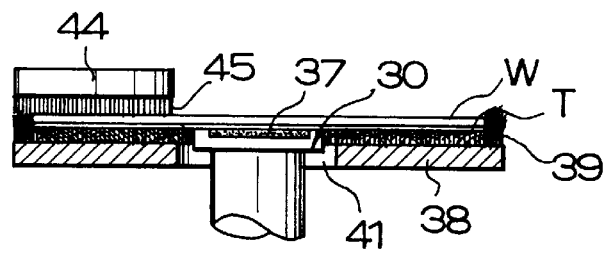
Figure 5C:
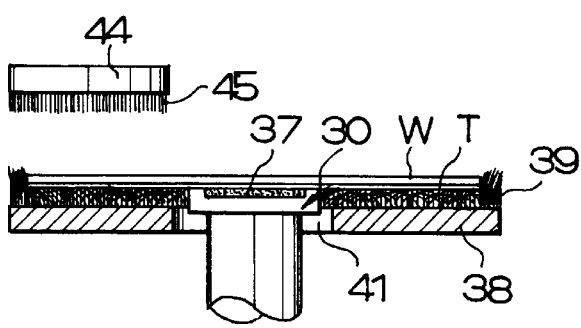

Referring to FIGS. 5a, 5b and 5c, the manner in which a selected wafer W is washed in the spinning washer 21 is described below.

As illustrated in FIG. 5A, the wafer to be washed is put on the spinning table 30 with its tape T down to be sucked to the suction section 37. The annular base 38 and the first stiff-hair section 39 are positioned to be apart down from the spinning table 30. This position is called herein "inoperative position" for the first brush 39. The disk 44 and the second stiff-hair section 45 is positioned to be apart above from the spinning table 30. Likewise, this position is called herein "inoperative position" for the second brush 45.

The first pistons 42 are raised gradually until the stiff-hair section 39 has been pushed against the bottom side of the wafer W, allowing the underlying area of the stiff-hair section to be yieldingly depressed while permitting the surrounding area of the stiff-hair section to be upright round the circumference of the wafer somewhat beyond the upper surface of the wafer W, thereby permitting the circumferential side of the wafer to be put in contact with stiff hairs. This position is called "operative position" for the first brush 39.

At the same time the second piston 48 is made to extend downward until the stiff-hair section of the second brush 45 has been put in contact with the wafer W. This position is called "operative position" for the second brush 44.

Figure 6:
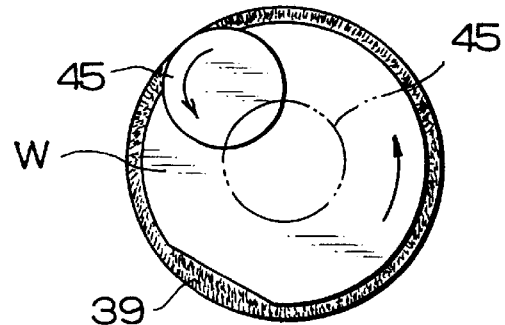
FIG. 6 illustrates, in plane, how the semiconductor wafer is washed.
Figure 7:
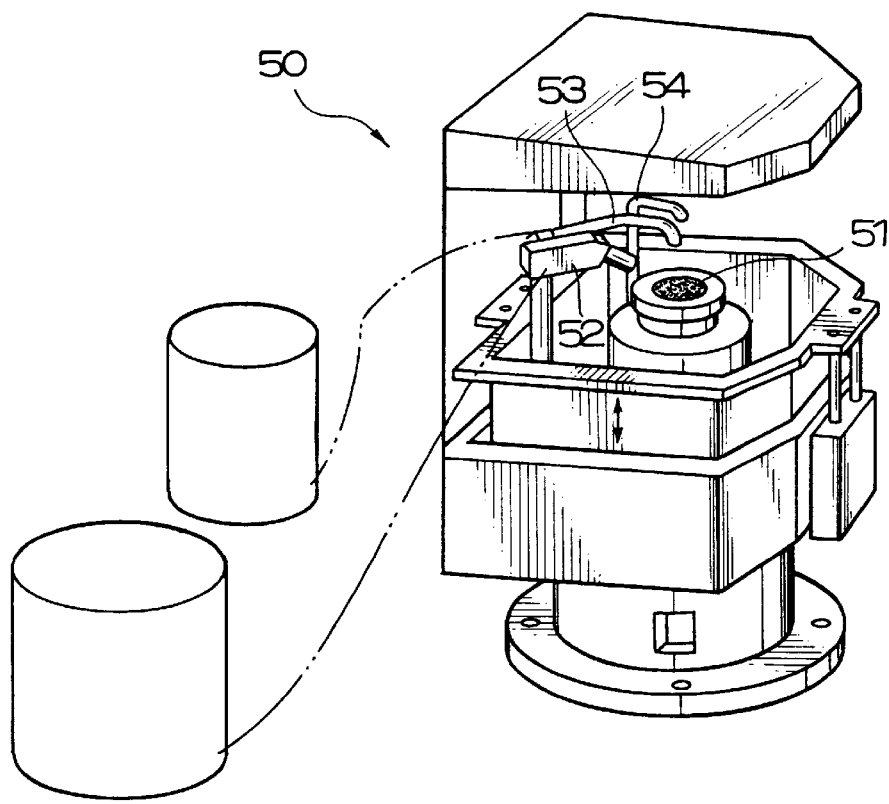
FIG. 7 is a perspective view of a conventional spinning washer.
Figure 8:
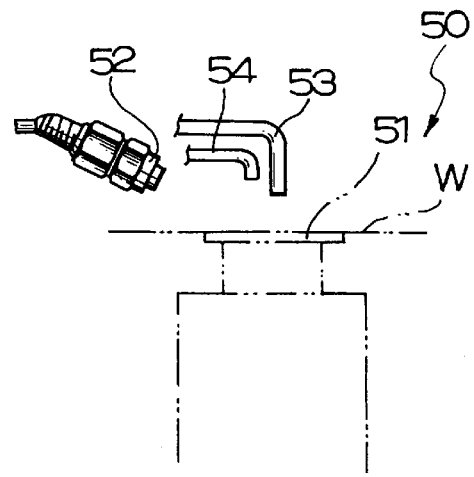
FIG. 8 is an enlarged view of the major part of the conventional spinning washer.
Figure 9:
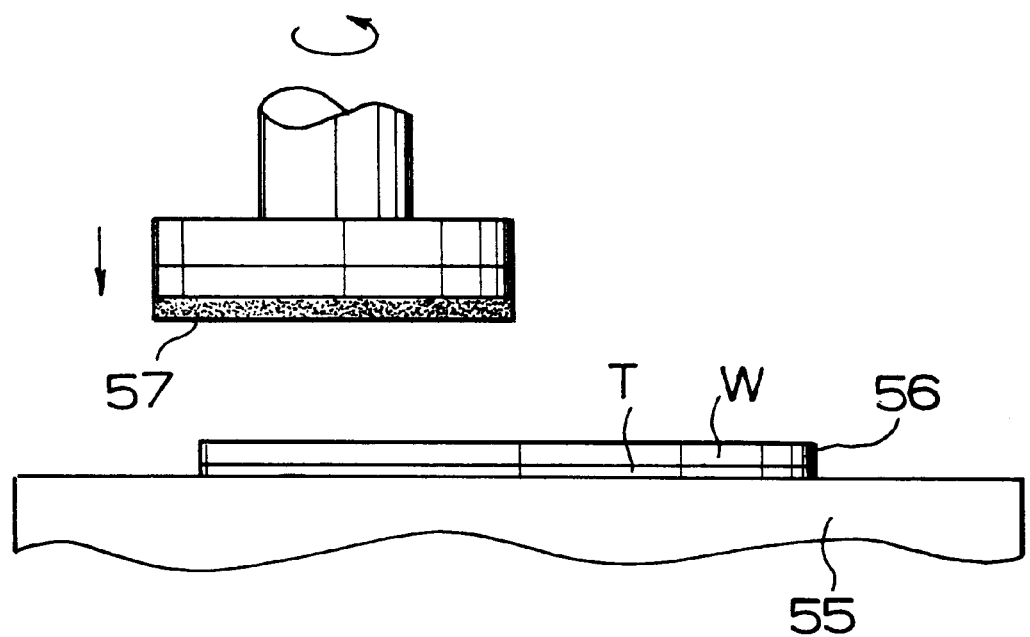
FIG. 9 illustrates how a semiconductor wafer on the holding table is ground.

When the first and second brushes 39 and 45 are put in their operative positions, the wafer W is sandwiched between these brushes 39 and 45, and then the spinning table 30 is rotated, and at the same time, water is flushed from the water flushing means 31 to the wafer W, thereby allowing the second brush 45 to wash the wafer W with water. Then, the rotating second brush 45 swings from a selected point on the circumference of the first brush 39 (see the circle drawn in solid line in FIG. 6) to the center of the rotating wafer W (see the circle drawn in broken line in FIG. 6) and vice versa, thus permitting the effective washing on the whole surface of the wafer W.

On the other hand, the rear side of the wafer W is washed with the first brush 39, and the circumference side of the wafer W is washed with the first brush 39 to remove debris from the circumference side of the wafer W, thus facilitating the subsequent peeling-off of the tape T from the wafer W.

The first brush 39 supports the wafer W on its bottom, and therefore, the wafer W can resist to the pressure or weight applied by the water flush from the water flushing means 31, thus preventing the wafer W from being bent or broken. Accordingly the rejection rate for finished products can be improved.

After washing, the second brush 45 is withdrawn to the inoperative position, and the first brush 39 remains in the operative position while the spinning table 30 continues turning at the increased speed, as seen from FIG. 5c. Thus, the wafer W is dried by spinning. After dewatering, the first brush 39 is made to return to the inoperative position. Thus, the washing and drying of the wafer W is completed, and the wafer W has no debris on the opposite surfaces as well as the circumference side thereof.

The spinning washer is described as being installed in a grinding machine, but it can be used along with other machining apparatuses. Of course, it can be used alone.

As may be understood from the above, a spinning washer provide the following advantages:

the wafer can be washed while it is supported on the spinning table and the first brush means, and therefore, no matter how thin the wafer may be, there is no fear of causing an adverse effect such as bending or breaking, which otherwise, would be caused by flushing water, and accordingly the rejection rate for finished products can be improved; and the wafer is washed while being sandwiched between the first and second brushes, permitting its opposite surfaces to be completely washed, and thanks to the diameter of the first brush being larger than that of the wafer, the circumference side of the wafer is completely washed to remove debris therefrom, thus facilitating the subsequent peeling-off of the tape from the wafer.

What is claimed is:

1. A spinning washer comprising:

a spinning table for fixedly holding a wafer, the spinning table being capable of turning at a high speed;

water flushing means for flushing water to the wafer held on the spinning table;

first brush means which can be put in coplanar position relative to the lower surface of the wafer around the circumference of the spinning table; and second brush means confronting the first brush means, the second brush means being adapted to be selectively put in operative or inoperative position, the second brush means being put in contact with the upper surface of the wafer in the operative position.

2. A spinning washer according to claim 1, wherein the first brush means comprises an annular base having its outer diameter larger than that of the wafer, and an opening made at its center, the opening being large enough to allow the spinning table to pass freely therethrough, a first stiff-hair section stuck on the upper surface of the annular base, and a first piston-and-cylinder for raising or lowering the annular base, thereby putting the first stiff-hair section in the operative or inoperative position, when put in the operative position, the first stiff-hair section being yieldingly depressed by the overlying wafer, leaving the circumferential stiff-hair part upright, surrounding closely the circumference side of the wafer.

3. A spinning washer according to claim 2, wherein the second brush means comprises a disk, a second stiff-hair section stuck on the lower surface of the disk, an arm holding the disk rotatably, a second piston-and-cylinder for raising or lowering the arm, thereby putting the second stiff-hair section in operative or inoperative position, and a drive unit for rotating the second piston-and-cylinder thereby to swing the arm and hence the second brush means, when put in the operative position, the second stiff-hair section being pushed against the upper surface of the wafer, thus sandwiching the wafer between the first and second stiff-hair sections.

* * * * *